US008722446B2

(12) United States Patent
Lee et al.

(10) Patent No.: US 8,722,446 B2
(45) Date of Patent: May 13, 2014

(54) ACOUSTIC SENSOR AND METHOD OF MANUFACTURING THE SAME

(71) Applicant: Electronics and Telecommunications Research Institute, Daejeon (KR)

(72) Inventors: Jaewoo Lee, Daejeon (KR); Chang Han Je, Daejeon (KR); Woo Seok Yang, Daejeon (KR); Jongdae Kim, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 13/796,018

(22) Filed: Mar. 12, 2013

(65) Prior Publication Data

US 2013/0185928 A1 Jul. 25, 2013

Related U.S. Application Data

(62) Division of application No. 13/012,489, filed on Jan. 24, 2011, now Pat. No. 8,415,717.

(30) Foreign Application Priority Data

Oct. 22, 2010 (KR) ........................ 10-2010-0103368

(51) Int. Cl.
*H01L 21/00* (2006.01)

(52) U.S. Cl.
USPC ...................... 438/53; 438/619; 257/E21.503

(58) Field of Classification Search
USPC ........................... 438/411, 422; 257/E21.501
See application file for complete search history.

(56) References Cited

U.S. PATENT DOCUMENTS

| | | | | |
|---|---|---|---|---|
| 5,573,679 | A | 11/1996 | Mitchell et al. | |
| 6,667,189 | B1 * | 12/2003 | Wang et al. | 438/53 |
| 6,847,090 | B2 * | 1/2005 | Loeppert | 438/53 |
| 7,301,213 | B2 | 11/2007 | Matsubara et al. | |
| 7,358,151 | B2 | 4/2008 | Araki et al. | |
| 2004/0259286 | A1 | 12/2004 | Dehe et al. | |

FOREIGN PATENT DOCUMENTS

| | | | |
|---|---|---|---|
| JP | 2004-012895 | A | 1/2004 |
| KR | 10-2006-0114017 | A | 11/2006 |
| KR | 10-0977826 | | 8/2010 |
| KR | 10-2011-0067235 | A | 6/2011 |

OTHER PUBLICATIONS

Alfons Dehe, "Silicon microphone development and application", Sensors and Actuators A, vol. 133, No. 2, pp. 283-287 (2007).

* cited by examiner

*Primary Examiner* — Chandra Chaudhari
(74) *Attorney, Agent, or Firm* — Rabin & Berdo, P.C.

(57) ABSTRACT

Provided is an acoustic sensor. The acoustic sensor includes: a substrate including sidewall portions and a bottom portion extending from a bottom of the sidewall portions; a lower electrode fixed at the substrate and including a concave portion and a convex portion, the concave portion including a first hole on a middle region of the bottom, the convex portion including a second hole on an edge region of the bottom; diaphragms facing the concave portion of the lower electrode, with a vibration space therebetween; diaphragm supporters provided on the lower electrode at a side of the diaphragm and having a top surface having the same height as the diaphragm; and an acoustic chamber provided in a space between the bottom portion and the sidewall portions below the lower electrode.

10 Claims, 19 Drawing Sheets

ACOUSTIC SENSOR AND METHOD OF MANUFACTURING THE SAME

CROSS-REFERENCE TO RELATED APPLICATIONS

This is a divisional of co-pending U.S. application Ser. No. 13/012,489, filed Jan. 24, 2011. This U.S. non-provisional patent application claims priority under 35 U.S.C. §119 of Korean Patent Application No. 10-2010-0103368, filed on Oct. 22, 2010, the entire contents of which are hereby incorporated by reference.

BACKGROUND OF THE INVENTION

The present invention disclosed herein relates to a micro device using Micro Electro Mechanical Systems (MEMS) technology, and more particularly, to a condenser-type acoustic sensor and a method of manufacturing the same.

An acoustic sensor (or a microphone) is a device converting an audio into an electrical signal. As developments of micro wire/wireless devices are accelerated recently, a size of the acoustic sensor becomes more miniaturized. Accordingly, the latest acoustic sensor using MEMS is developed.

The acoustic sensor is largely classified into a piezo-type and a condenser-type. The piezo-type uses piezo effect (a potential difference occurs at both ends of a piezoelectric material when physical pressure is applied to the piezoelectric material) and converts the pressure of an audio signal into an electrical signal. The piezo-type has many limitations in applications due to low band and irregular characteristics of audio band frequencies. The condenser-type uses a principle of a condenser having two facing electrodes in which one electrode of an acoustic sensor is fixed and the other electrode serves as a diaphragm. This is, if the diaphragm vibrates according to a pressure of an audio signal, an accumulated charge between the electrodes is changed because a capacitance therebetween is changed and thus current flows. The condense-type has advantages such as stability and excellent frequency characteristic. Due to the frequency characteristic, the acoustic sensor may typically use the conductive-type device.

SUMMARY OF THE INVENTION

The present invention provides an acoustic sensor with improved sound pressure response characteristic.

The present invention also provides an acoustic sensor manufactured simply only through an upper process of a substrate.

Embodiments of the present invention provide acoustic sensors including: a substrate including sidewall portions and a bottom portion extending from a bottom of the sidewall portions; a lower electrode fixed at the substrate and including a concave portion and a convex portion, the concave portion including a first hole on a middle region of the bottom, the convex portion including a second hole on an edge region of the bottom; diaphragms facing the concave portion of the lower electrode, with a vibration space therebetween; diaphragm supporters provided on the lower electrode at a side of the diaphragm and having a top surface having the same height as the diaphragm; and an acoustic chamber provided in a space between the bottom portion and the sidewall portions below the lower electrode.

In some embodiments, the diaphragm supporters may extend from at least four edges of the diaphragm.

In other embodiments, the diaphragm may further include an etching window having a smaller area than the top of the convex portion of the lower electrode and connected to the vibration space between the diaphragm supporters.

In still other embodiments, the diaphragm supporter may be formed of the same material as the diaphragm.

In even other embodiments, the acoustic sensors may further include a lower electrode supporter provided below the convex portion of the lower electrode and extending from the bottom portion of the substrate to support the lower electrode.

In yet other embodiments, the acoustic sensors may further include a lower electrode supporter definition layer surrounding the lower electrode supporter.

In further embodiments, the acoustic sensor may further include an acoustic chamber definition layer provided between the sidewall portions of the substrate and the acoustic chamber and surrounding the lower electrode supporter definition layer with the acoustic chamber therebetween.

In still further embodiments, a bottom surface of the bulge portion of the lower electrode may be lower than a top surface of the sidewall portions of the substrate.

In even further embodiments, the acoustic sensors may further include an interlayer insulation layer including the first and second holes between the lower electrode and the substrate and a lower electrode insulation layer including the first and second holes between the lower electrode and the diaphragm, wherein a stacked layer of the interlayer insulation layer, the lower electrode, and the lower electrode insulation layer is used as a fixing electrode.

In other embodiments of the present invention, methods of manufacturing an acoustic sensor include: forming a recess region in a substrate and an acoustic chamber definition layer surrounding the recess region and having a lower bottom surface than the recess region; forming a lower electrode including a first hole provided in the substrate of the recess region and a second hole provided inside the acoustic chamber definition layer at the external of the recess region; forming a diaphragm facing the lower electrode with a vibration space therebetween, on a lower electrode corresponding to the recess region, and diaphragm supporters having a top surface having the same height as the diaphragm at a side of the diaphragm; and forming an acoustic chamber by etching the substrate inside the acoustic chamber definition layer through an etching window provided at a side of the diaphragm and the first and second holes connected to the vibration space.

In some embodiments, the diaphragm supporters may extend from at least four edges of the diaphragm and is integrally formed with the diaphragm.

In other embodiments, the forming of the diaphragm and the diaphragm supporter may further include: forming a sacrificial layer planarized to be level with the lower electrode on the lower electrode corresponding to the recess region and inside the first and second holes; forming a diaphragm on the sacrificial layer corresponding to the recess region and forming diaphragm supporters with a top surface having the same height as the diaphragm at a side of the diaphragm; and removing the sacrificial layer.

In still other embodiments, the diaphragm may be formed with a smaller region than a top portion of the recess region to expose an edge surface of the sacrificial layer.

In even other embodiments, the methods, before the forming of the diaphragm, further including forming an interlayer insulation layer below the lower electrode and forming a lower electrode insulation layer on the lower electrode, wherein the first and second holes are formed by penetrating from the lower electrode insulation layer to the interlayer insulation layer after the forming of the lower In yet other embodiments, the sacrificial layer may be formed of a material having a different etch selectivity than the lower electrode insulation layer and the interlayer insulation layer.

In further embodiments, the sacrificial layer below the diaphragm may be selectively etched and removed by allowing an etching solution or an etching gas to flow into the sacrificial layer below the diaphragm through an exposed edge surface of the sacrificial layer.

In still further embodiments, the methods, during the forming of the acoustic chamber definition layer, may further include forming a lower electrode supporter definition layer surrounding one region of the substrate in the substrate below the recess region.

In even further embodiments, the methods, during the forming of the acoustic chamber, may further include forming a lower electrode supporter extending from the bottom portion of the substrate below the recess region, wherein the lower electrode supporter is defined by the lower electrode supporter definition layer surrounding the outer wall thereof; and the first hole is formed at the external of the lower electrode supporter definition layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 4A through 11A are plan views illustrating a method of manufacturing an acoustic sensor according to an embodiment of the present invention. FIGS. 4B through 11B are sectional views taken along the line I-I' of FIGS. 4A through 11A. FIGS. 4C through 11C are sectional views taken along the line II-II' of FIGS. 4A through 11A.

DETAILED DESCRIPTION OF PREFERRED EMBODIMENTS

Figure 1:
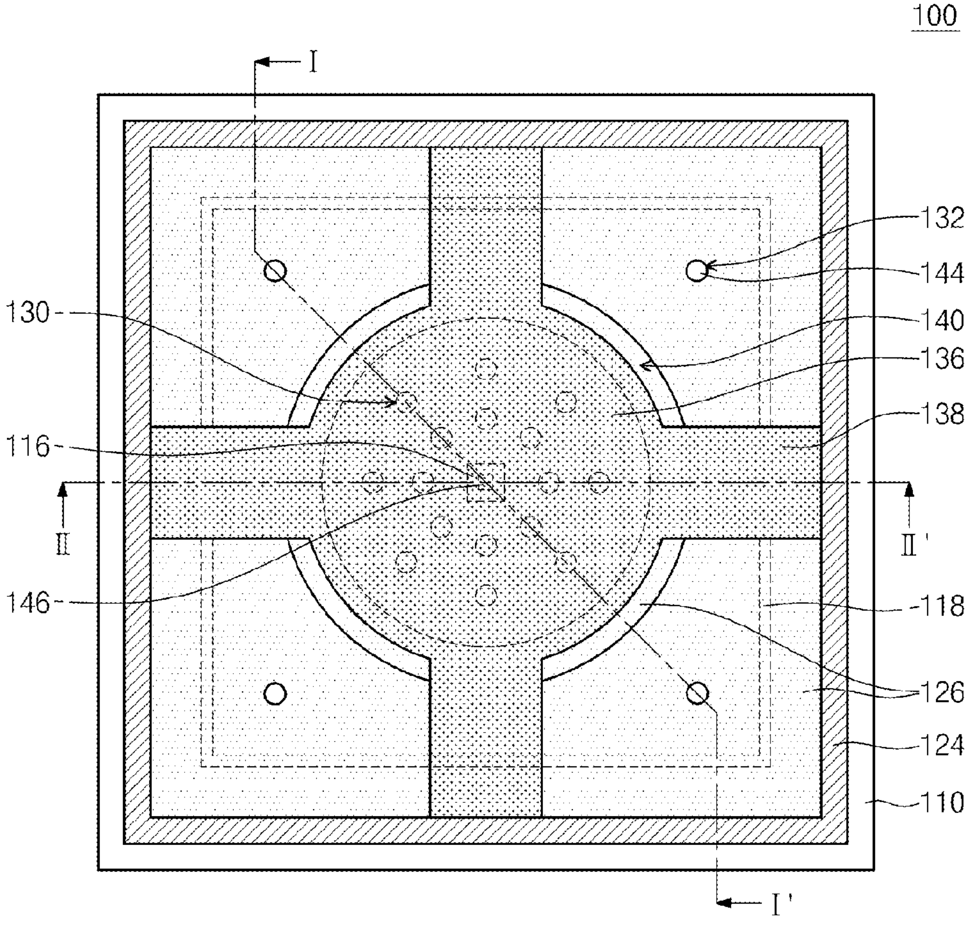
FIG. 1 is a plan view of an acoustic sensor according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the dimensions of layers and regions are exaggerated for clarity of illustration. Like reference numerals refer to like elements throughout.

Figure 2:
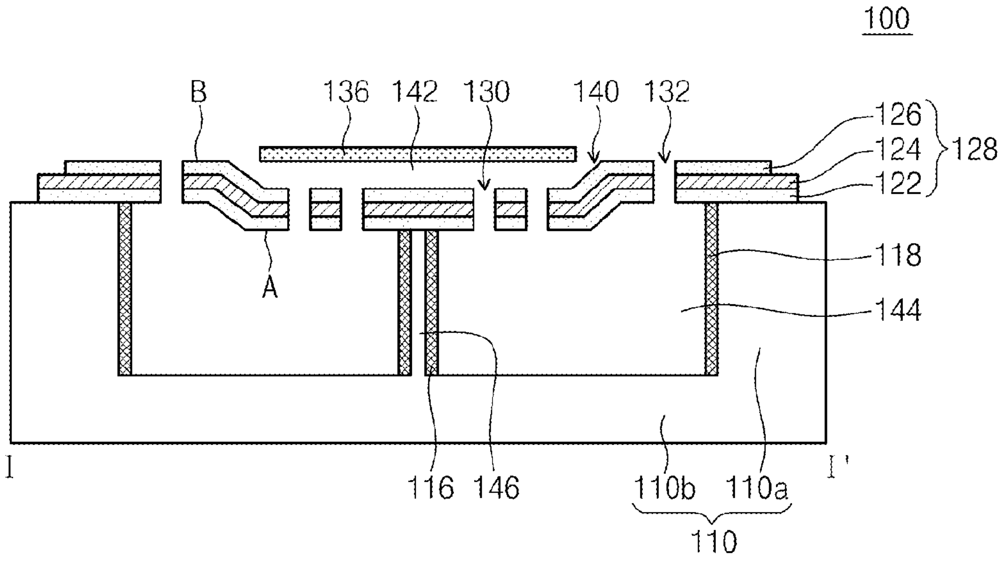
FIG. 2 is a sectional view taken along the line I-I' of FIG. 1.
Figure 3:
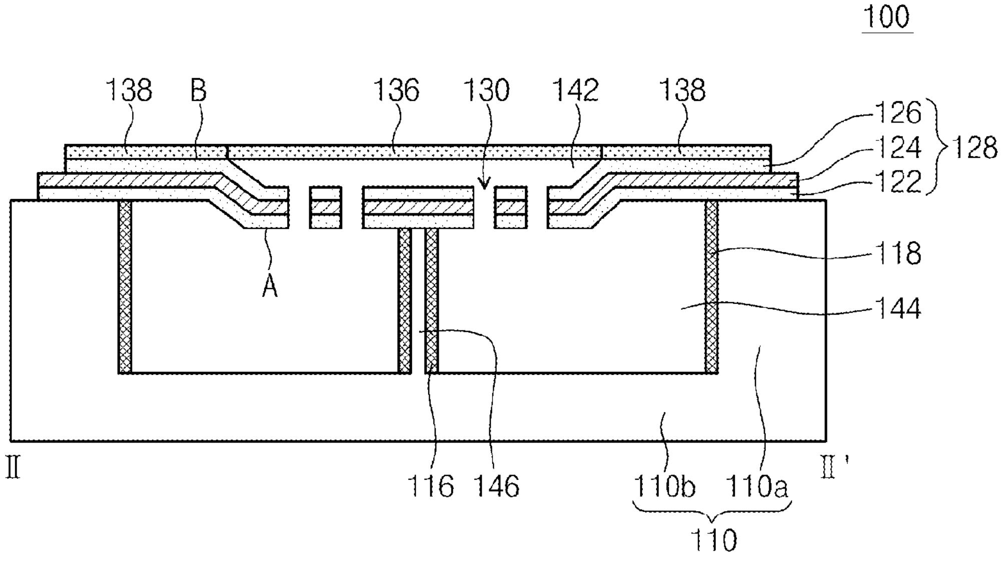
FIG. 3 is a sectional view taken along the line II-II' of FIG. 1.

FIG. 1 is a plan view of an acoustic sensor according to an embodiment of the present invention. FIG. 2 is a sectional view taken along the line I-I' of FIG. 1. FIG. 3 is a sectional view taken along the line II-II' of FIG. 1.

Referring to FIGS. 1 through 3, the acoustic sensor 100 includes a substrate 110, a fixing electrode 128, a diaphragm 136, diaphragm supporters 138, and an acoustic chamber 144.

The substrate 110 may include sidewall portions 110*a* and a bottom portion 110 extending from the bottom of the sidewall portions 110*a*. The substrate 110 may be a Si substrate or a compound semiconductor substrate. For example, the compound semiconductor substrate may be a semiconductor substrate formed of GaAs or InP. The substrate 110 may be rigid or flexible substrate.

The fixing electrode 128 may include an interlayer insulation layer 122, a lower electrode 124, and a lower electrode insulation layer 126. The interlayer insulation layer 122 and the lower electrode insulation layer 126 may be formed of an oxide layer or an organic layer. The interlayer insulation layer 122 and the lower electrode insulation layer 126 may be omitted.

The fixing electrode 128 may include a concave portion A including first holes 130 on the middle region of the bottom portion 110*b* and a convex portion B provided on the edge region of the bottom portion 110*b* and the sidewall portion 110*a* including second holes 132 on the edge region of the bottom portion 110*b*. The bottom of the concave region A of the fixing electrode 128 is disposed below the top of the sidewall portions 110*a* of the substrate 110.

The concave portion A may be provided with a circular form. The first holes 130 are defined as an acoustic chamber etching hole and the second holes 132 may be defined as an acoustic chamber window. The acoustic chamber etching holes 130 is provided with a radial shape.

The diaphragm 136 may be disposed to face the concave portion A of the fixing electrode 128, with a vibration space 142 therebetween. The diaphragm 136 is used as a counter electrode of the fixing electrode 128 and also, the fixing electrode 128 and the diaphragm 136 form a pair of electrodes.

The diaphragm 136 may be provided with a single layer structure of a conductive layer or a stacked layer structure of an insulation layer and a conductive layer. The conductive layer may be formed of metal, for example.

The diaphragm 136 may have a thickness of several μm and may have a circular shape. The diaphragm 136 may be provided with a smaller area than the top of the concave portion A of the fixing electrode 128 in order to secure an inflow path of an etching solution or an etching gas at the side. In an embodiment of the present invention, the diaphragm 136 may be provided with a circular shape having a smaller radius than the top of the concave portion A. The vibration space 142 may be defined by a diaphragm gap. The vibration space 142 is connected to the acoustic chamber etching holes 130.

The diaphragm supporters 138 may have the top surface having the same height as the diaphragm 136 at the side of the diaphragm 136 and may be provided on the lower electrode insulation layer 126 so as to suppress left-right movements of the diaphragm 136 and the diaphragm supporters 138 during vibration caused by sound pressure.

The diaphragm supporters 138 may be provided with an integration type extending from one edge of the diaphragm 136. The diaphragm supporters 138 are symmetrically arranged and may be provided in at least four. The diaphragm supporters 138 may be formed of the same material as the diaphragm 136.

An etching window 140 connected to the vibration space 142 may be further provided at the side of the diaphragm 136 between the diaphragm supporters 138.

The acoustic chamber 144 may be provided in a space between the bottom portion 110*b* and the sidewall portions 110*a* below the fixing electrode 128. The acoustic chamber 144 is connected to the acoustic chamber etching holes 130 and the acoustic chamber windows 132.

The acoustic sensor 100 may further include a lower electrode supporter 146 which extends from the bottom portion 110*b* of the substrate 110 and thus supporting the lower electrode 124 below the concave portion A of the fixing electrode 128. As one example, the lower electrode supporter 146 may have a rectangular pillar.

The acoustic sensor 100 may further include a lower electrode supporter definition layer 116 surrounding the outer wall of the lower electrode supporter 146. As one example, the lower electrode supporter definition layer 116 may have a closed loop with a width of 1 to several μm and a depth of about 10 μm to several hundreds μm. An outer appearance of the lower electrode supporter 146 may be determined by the inner circumference of the lower electrode supporter definition layer 116. The lower electrode supporter definition layer 116 may be formed of an oxide layer.

The acoustic sensor 100 may further include an acoustic chamber definition layer 118 surrounding the lower electrode supporter definition layer 116 between the sidewall portions 110*a* of the substrate 110 and the acoustic chamber 144. The acoustic chamber definition layer 118 may have a closed loop with a width of 1 to several μm and a depth of about 10 μm to several hundreds μm. The acoustic chamber definition layer 118 may be formed of an oxide layer.

FIGS. 4A through 11A are plan views illustrating a method of manufacturing an acoustic sensor according to an embodiment of the present invention. FIGS. 4B through 11B are sectional views taken along the lines I-I' of FIGS. 4A through 11A, respectively. FIGS. 4C through 11C are sectional views taken along the lines II-II' of FIGS. 4A through 11A, respectively. FIG. 6D is a perspective view of FIG. 6A.

Figure 4A:
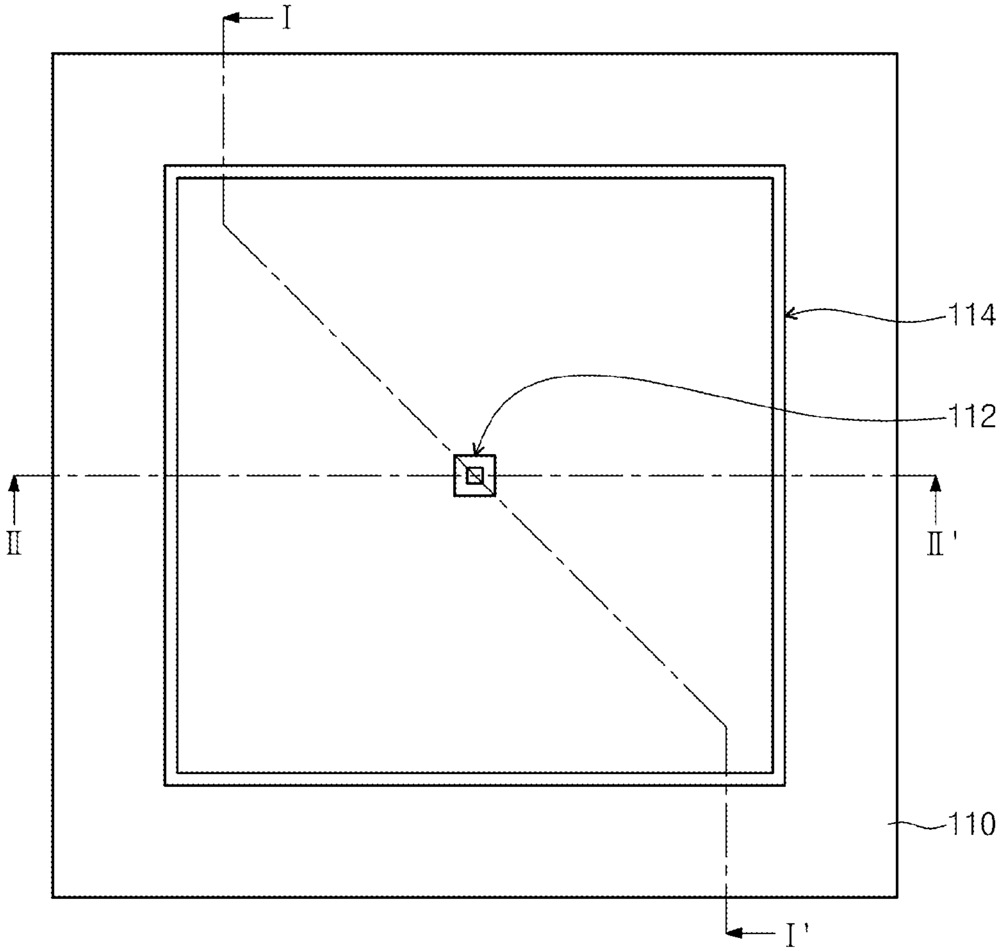
Figure 4B:
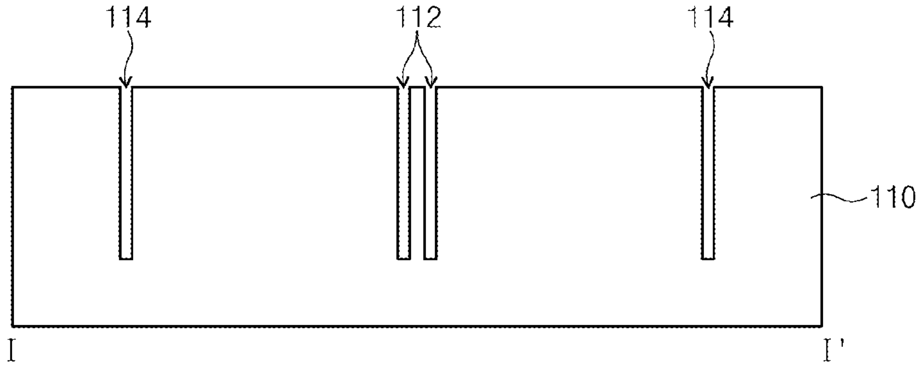
Figure 4C:
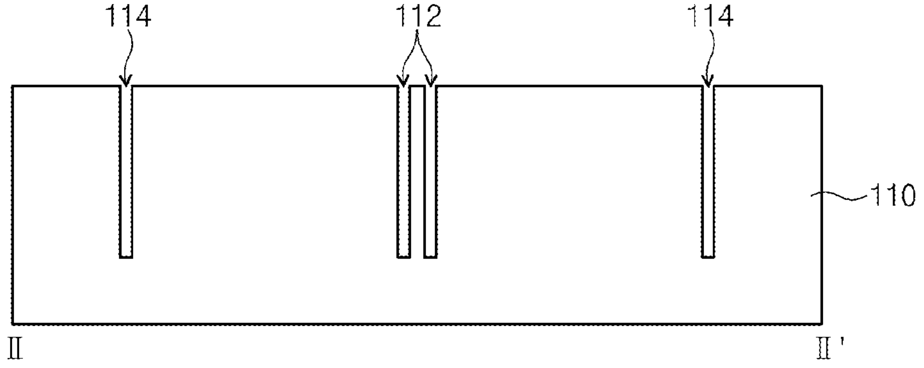

Referring to FIGS. 4A through 4C, a first groove 112 and a second groove 114 spaced a predetermined distance apart from the first groove 112 and surrounding the first groove 112 may be formed in the substrate 110.

The substrate 110 may be a Si substrate or a compound semiconductor substrate. For example, the compound semiconductor substrate may be a semiconductor substrate formed of GaAs or InP. The substrate 110 may be rigid or flexible substrate.

The first and second grooves 112 and 114 may be formed using a dry etching method. Each of the first and second grooves 112 and 114 may have a closed loop of a square structure. Each of the first and second grooves 112 and 114 may be formed with a width of 1 to several μm and a depth of about 10 μm to several hundreds μm.

Figure 5A:
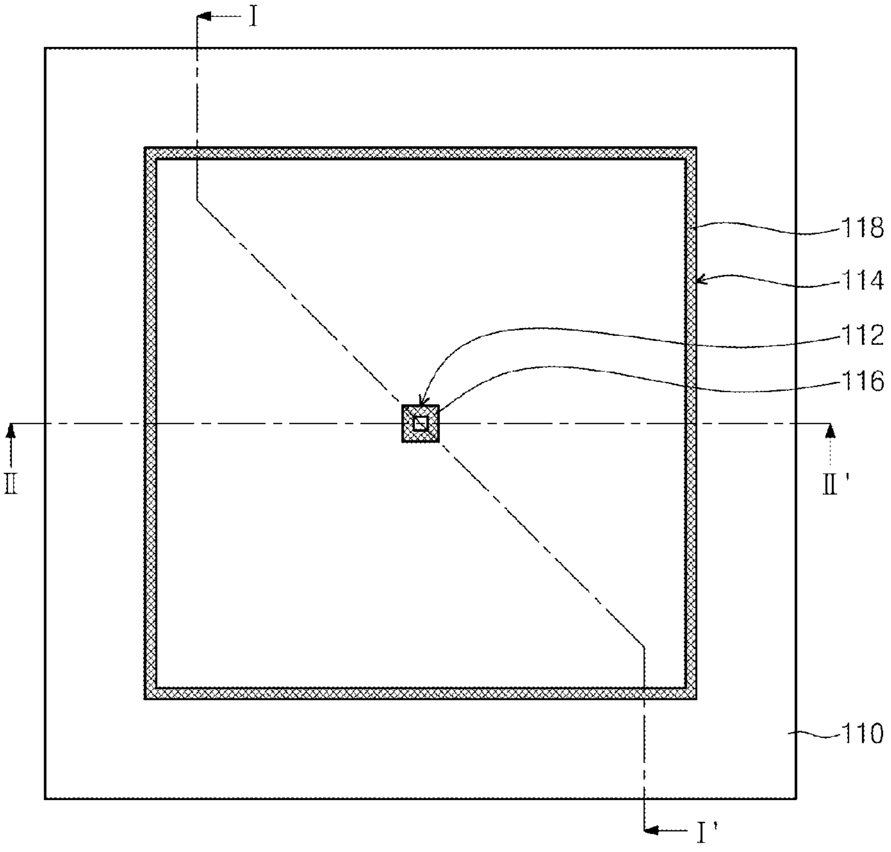
Figure 5B:
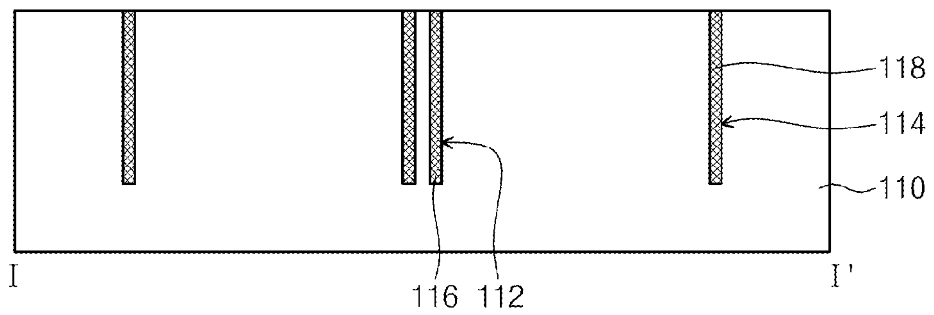
Figure 5C:
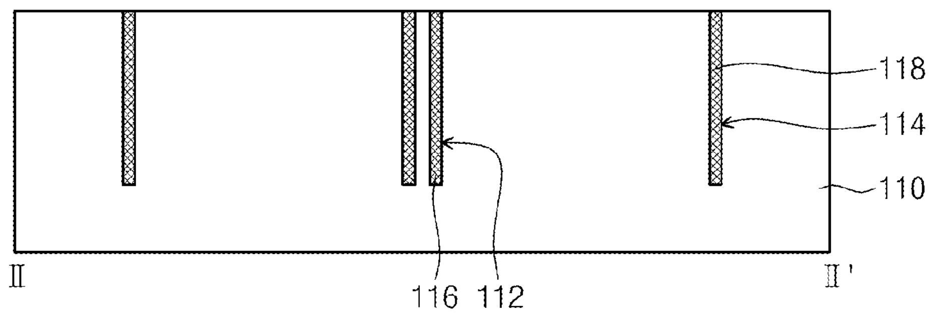
Figure 6A:
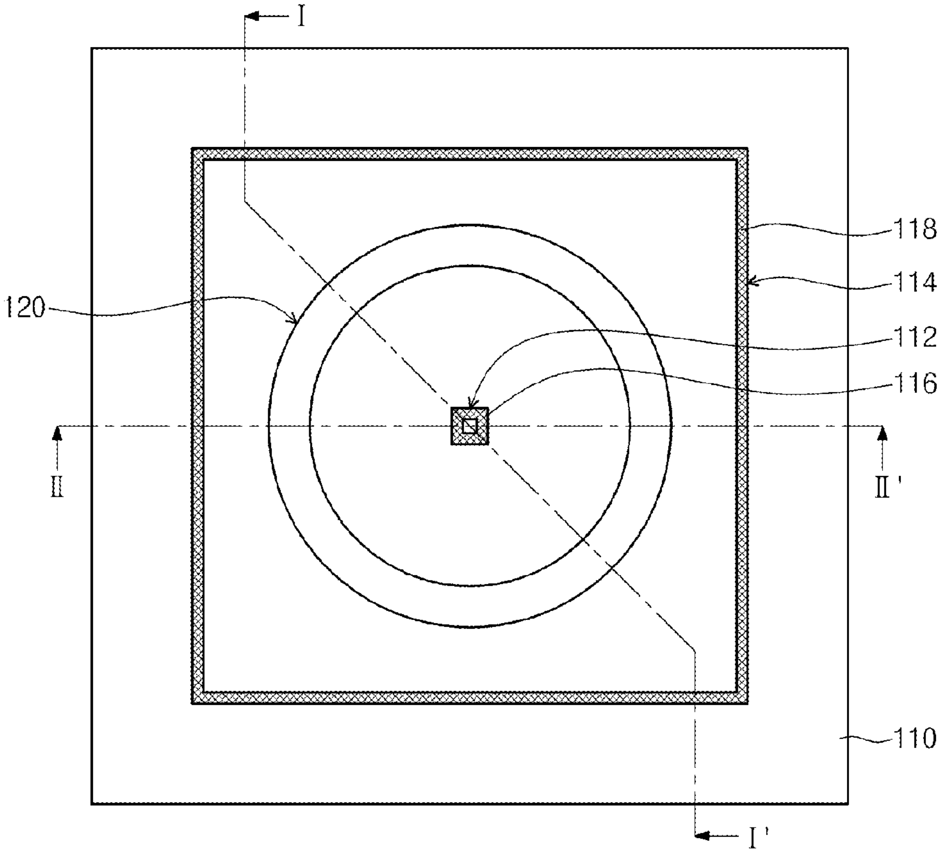
Figure 6B:
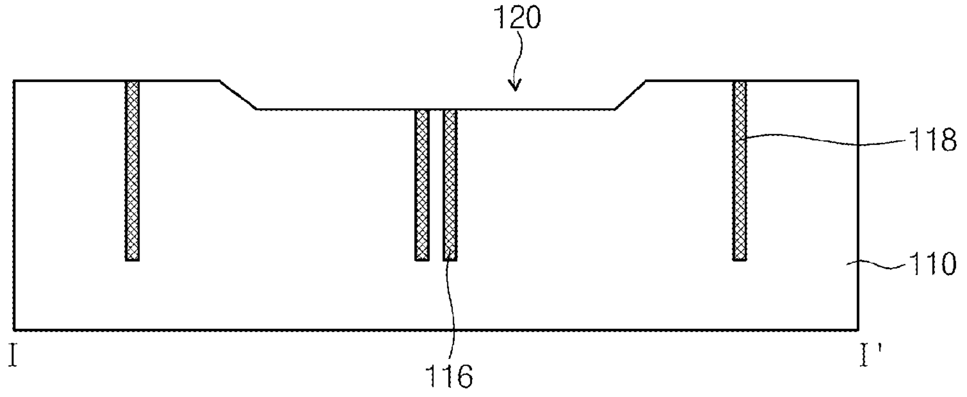
Figure 6C:
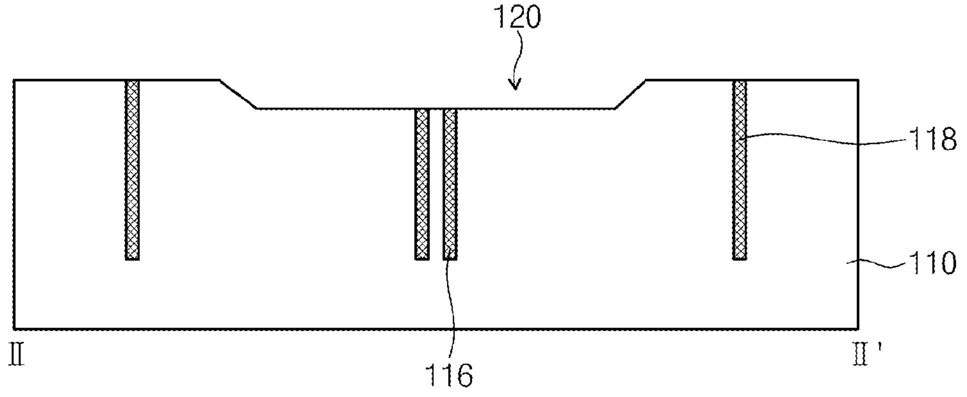
Figure 6D:
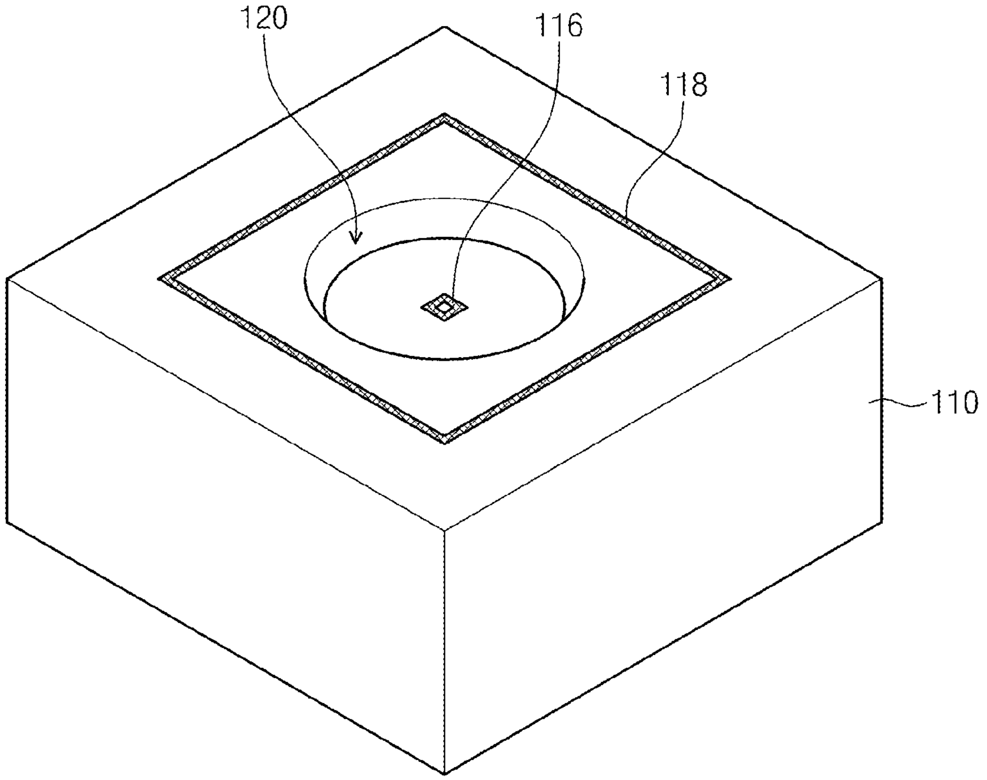
FIG. 6D is a perspective view of FIG. 6A.

Referring to FIGS. 5A through 5C, a lower electrode supporter definition layer 116 may be formed in the first groove 112 and an acoustic chamber definition layer 118 may be formed in the second groove 114.

The lower electrode supporter definition layer 116 and the acoustic chamber definition layer 118 may be formed of an oxide layer. The lower electrode supporter definition layer 116 and the acoustic chamber definition layer 118 may be formed by forming an insulation layer (not shown) on the substrate 110 with the first and second grooves 112 and 114 and then planarizing the insulation layer.

Figure 11A:
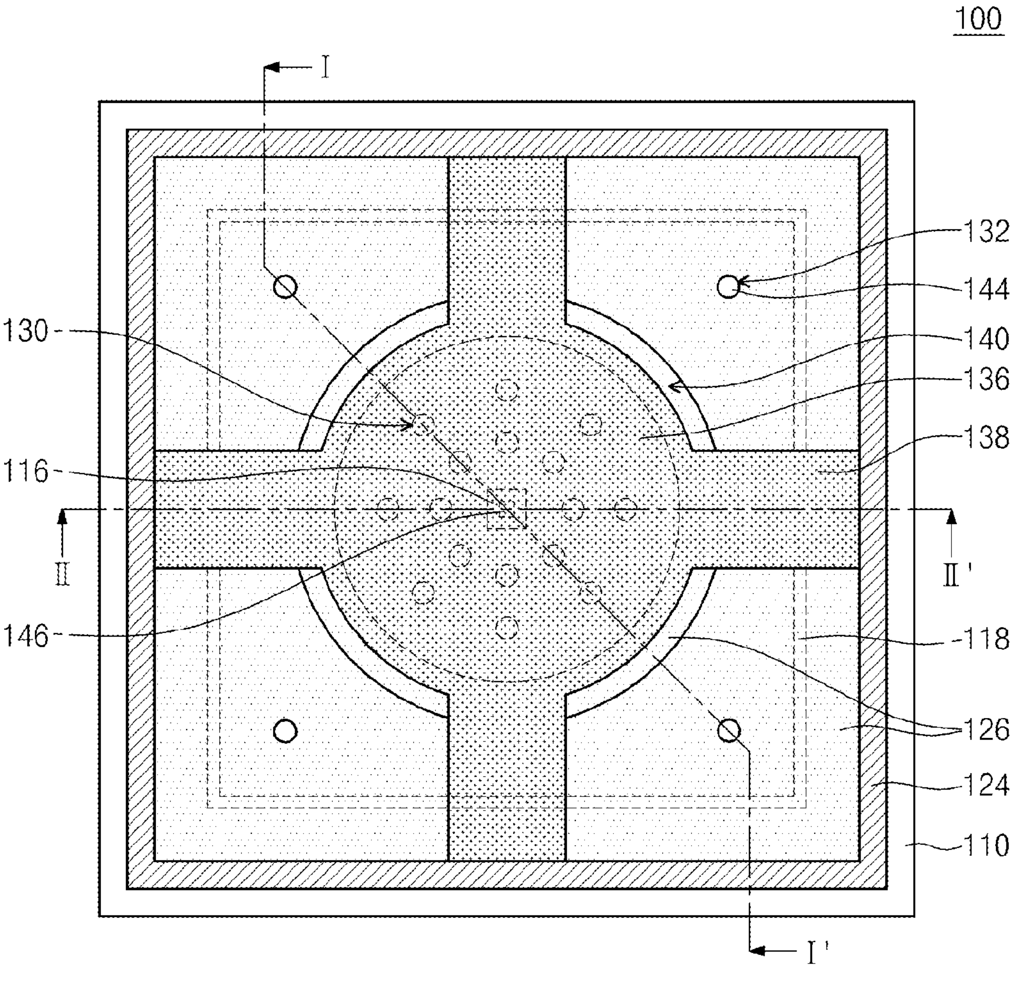
Figure 11B:
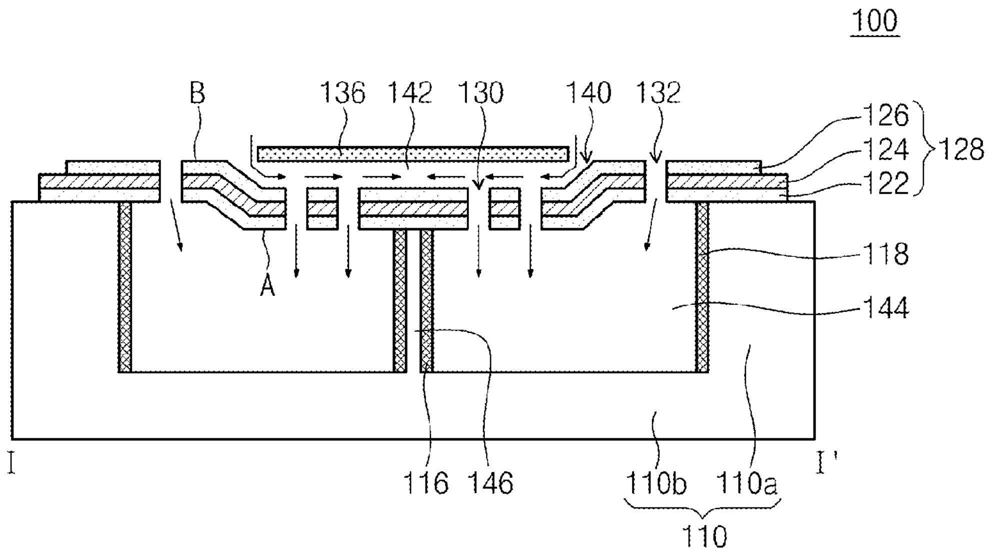

The lower electrode supporter definition layer 116 is used for manufacturing the lower electrode supporter 146 of FIG. 11B having a predetermined shape by preventing the inflow of an etching solution or an etching gas to the inside of the lower electrode supporter definition layer when the acoustic chamber 144 of FIG. 11B is formed in the substrate 110 during the next process.

The acoustic chamber definition layer 118 is used for manufacturing the acoustic chamber 114 of FIG. 11B having a predetermined shape by preventing the inflow of an etching solution or an etching gas to the outside of the acoustic chamber definition layer 118 when the acoustic chamber 114 of FIG. 11B during the next process.

The planarization may be performed through blanket etch, etch back, or a chemical mechanical polishing (CMP) process.

Referring to FIGS. 6A through 6D, a diaphragm chamber 120 defined by a recess region is formed by recessing the top middle of the substrate 110.

Figure 9A:
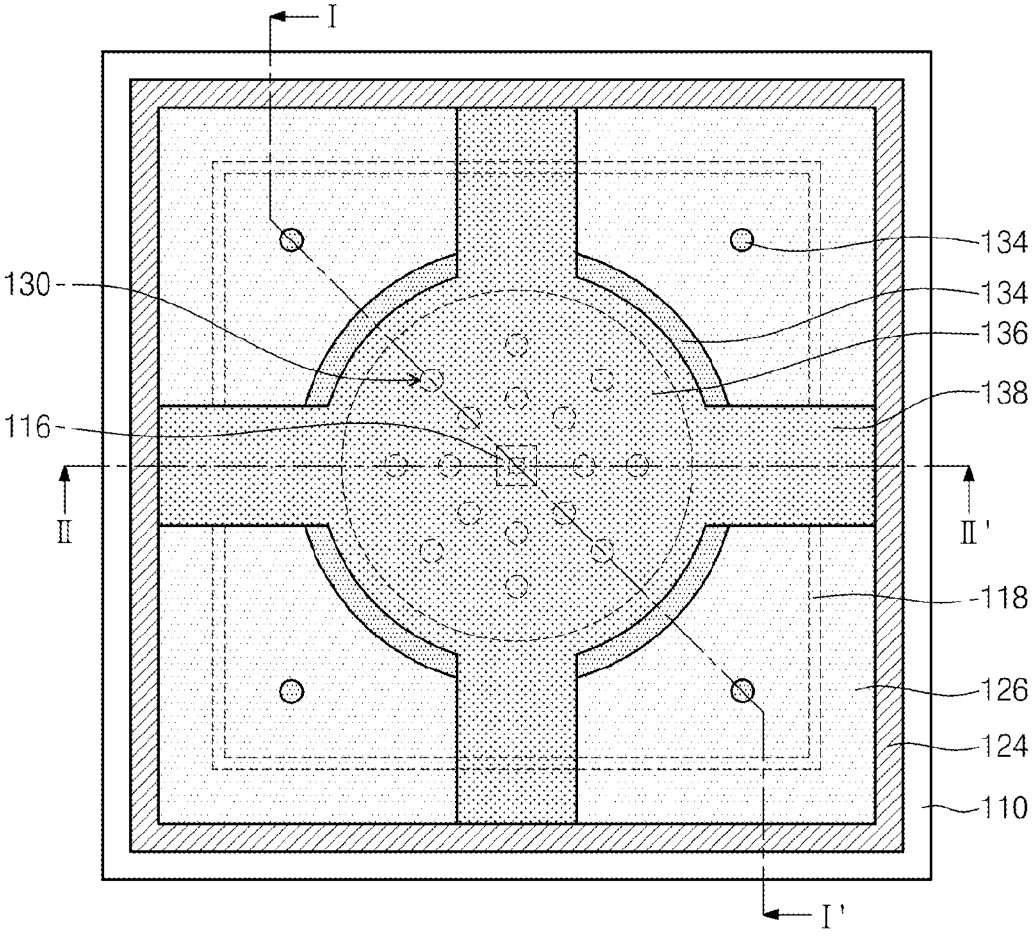
Figure 9B:
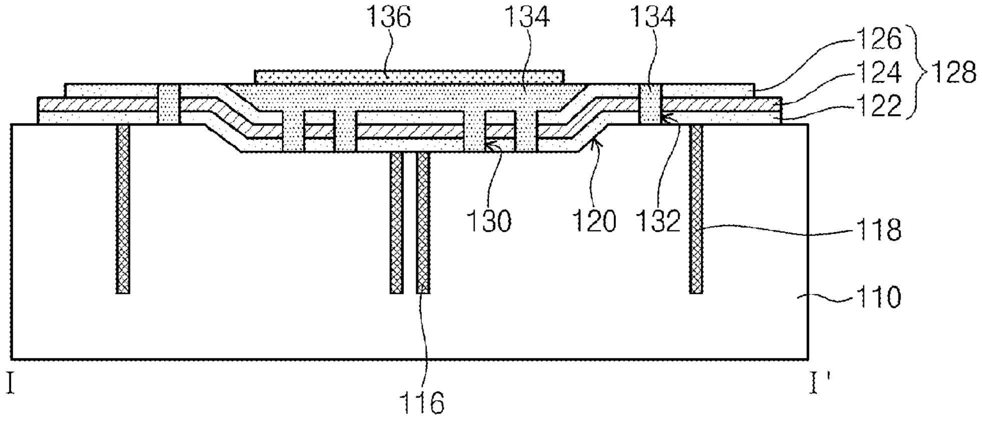
Figure 9C:
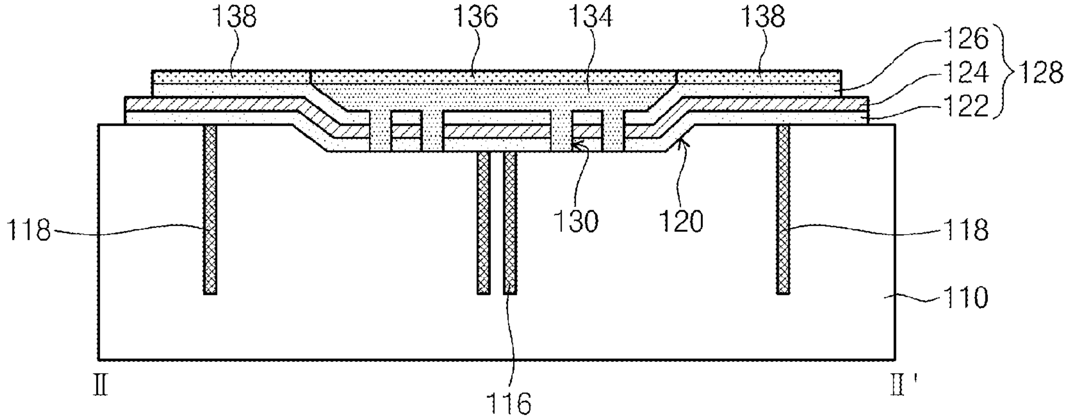

The diaphragm chamber 120 is used for allowing the top surface of the diaphragm supporter 138 of FIG. 9C to be level with the top surface of the diaphragm 136 of FIG. 9C when the diaphragm 136 of FIG. 9C is formed in the next process.

The diaphragm chamber 120 may be formed with a circular shape inside the acoustic chamber definition layer 118. The diaphragm chamber 120 may be provided on the lower electrode supporter definition layer 116.

During the forming of the diaphragm chamber 120, the upper portion of the lower electrode supporter definition layer 116 is partially etched. Accordingly, the lower electrode supporter definition layer 116 becomes lower than the acoustic chamber definition layer 118.

Figure 7A:
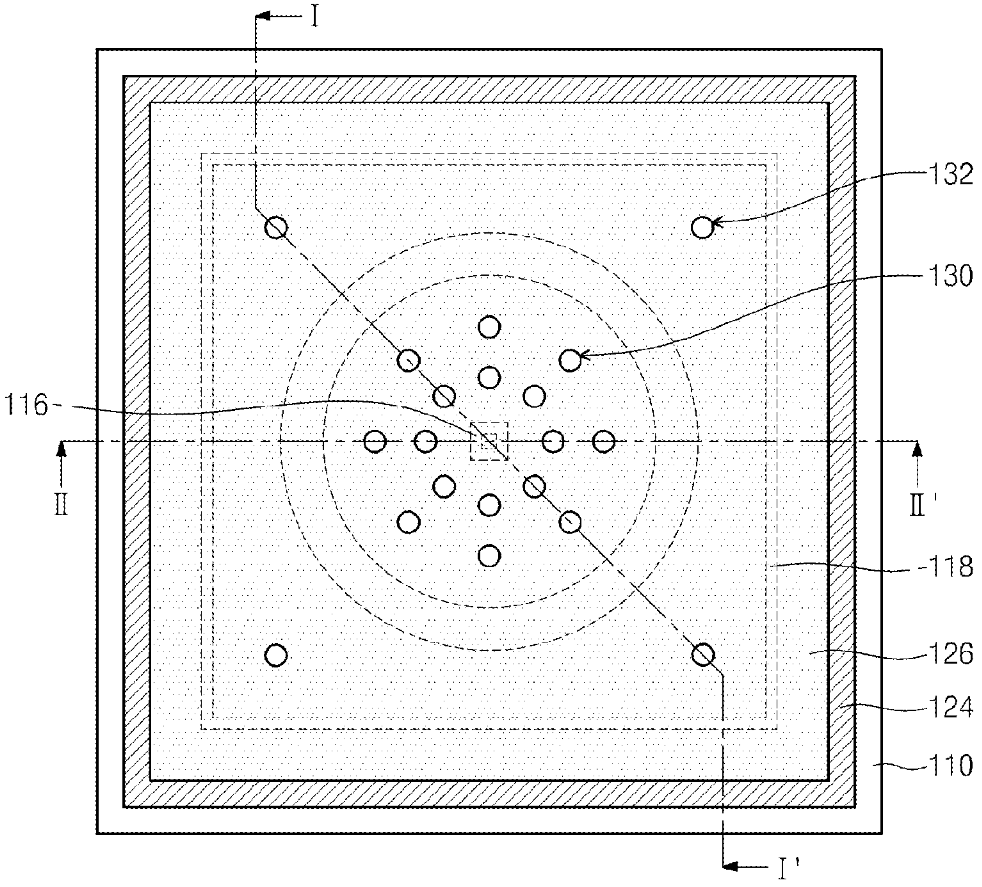
Figure 7B:
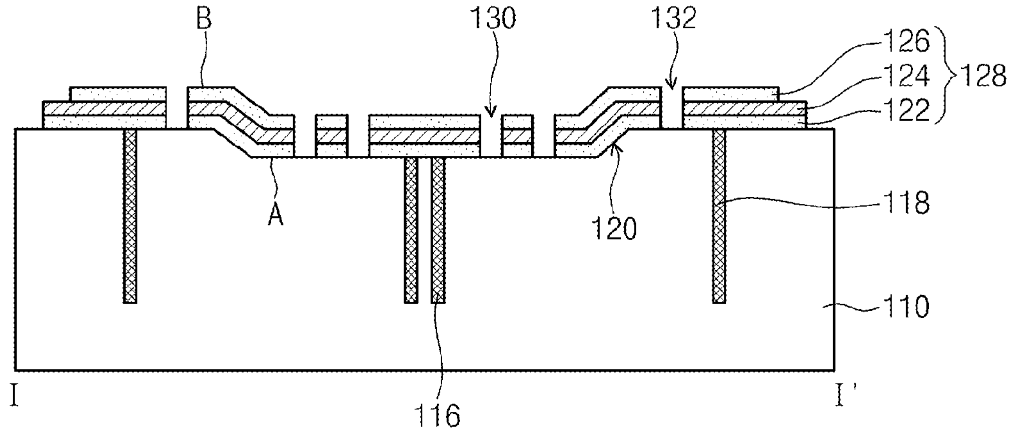
Figure 7C:
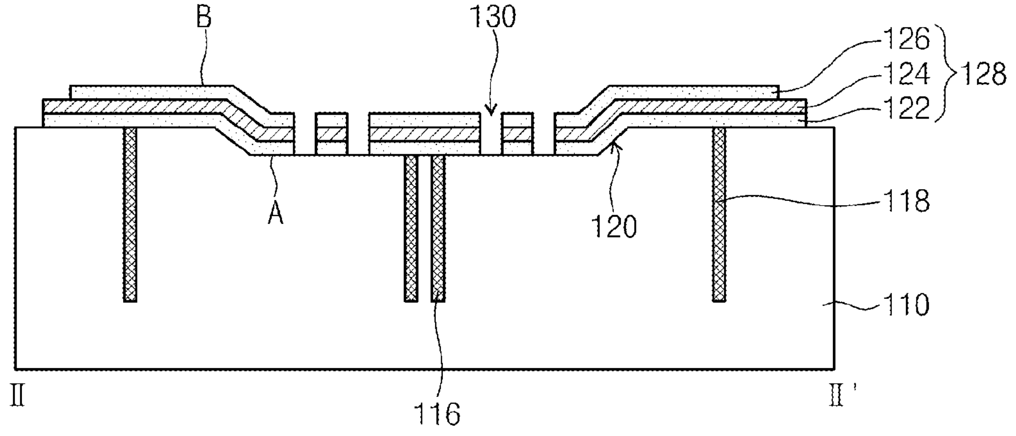

Referring to FIGS. 7A through 7C, an interlayer insulation layer 122, a lower electrode 124, and a lower electrode insulation layer 126 are sequentially formed on the lower electrode supporter definition layer 116, the acoustic chamber definition layer 118, and the exposed substrate 110. Accordingly, the diaphragm chamber 120 may be covered by the interlayer insulation layer 122, the lower electrode 124, and the lower electrode insulation layer 126.

Since the interlayer insulation layer 122 is used for insulating the lower electrode 124 from the substrate 110, it may be omitted. Since the lower electrode insulation layer 126 is used for insulating the lower electrode 124 from the diaphragm 136 of FIG. 9B formed later, it may be omitted.

The interlayer insulation layer 122 and the lower electrode insulation layer 126 may be formed of an oxide layer or an organic layer. At this point, the interlayer insulation layer 122, the lower electrode 124, and the lower electrode insulation layer 126 may be provided as a fixing electrode 128 of the acoustic sensor 100 of FIG. 11A. The fixing electrode 128 may have an uneven form including a concave portion A in a region of the diaphragm chamber 120 and a convex portion B in the remaining region except a region of the diaphragm chamber 120.

Substantially, the corresponding interlayer insulation layer 122, lower electrode 124, and lower electrode insulation layer 126 on the diaphragm chamber 120 may be used as a fixing electrode 128 of the acoustic sensor 100 of FIG. 11A.

First holes 130 and second holes 132 are formed in the fixing electrode 128 to allow the acoustic chamber 144 of FIG. 11B to be formed during the next process. The first holes 130 may be defined by the acoustic chamber etching hole 130. The second holes 132 may be defined by the acoustic chamber windows 132.

The acoustic chamber etching holes 130 may be formed outside the lower electrode supporter definition layer 116 in the region of the diaphragm chamber 120. For forming the acoustic chamber 144 of FIG. 11B smoothly, the acoustic chamber etching holes 130 may be disposed with a radial shape.

The acoustic chamber windows 132 may be formed in a region between the acoustic chamber etching holes 130 and the acoustic chamber definition layer 118 outside the diaphragm chamber 120.

Figure 8A:
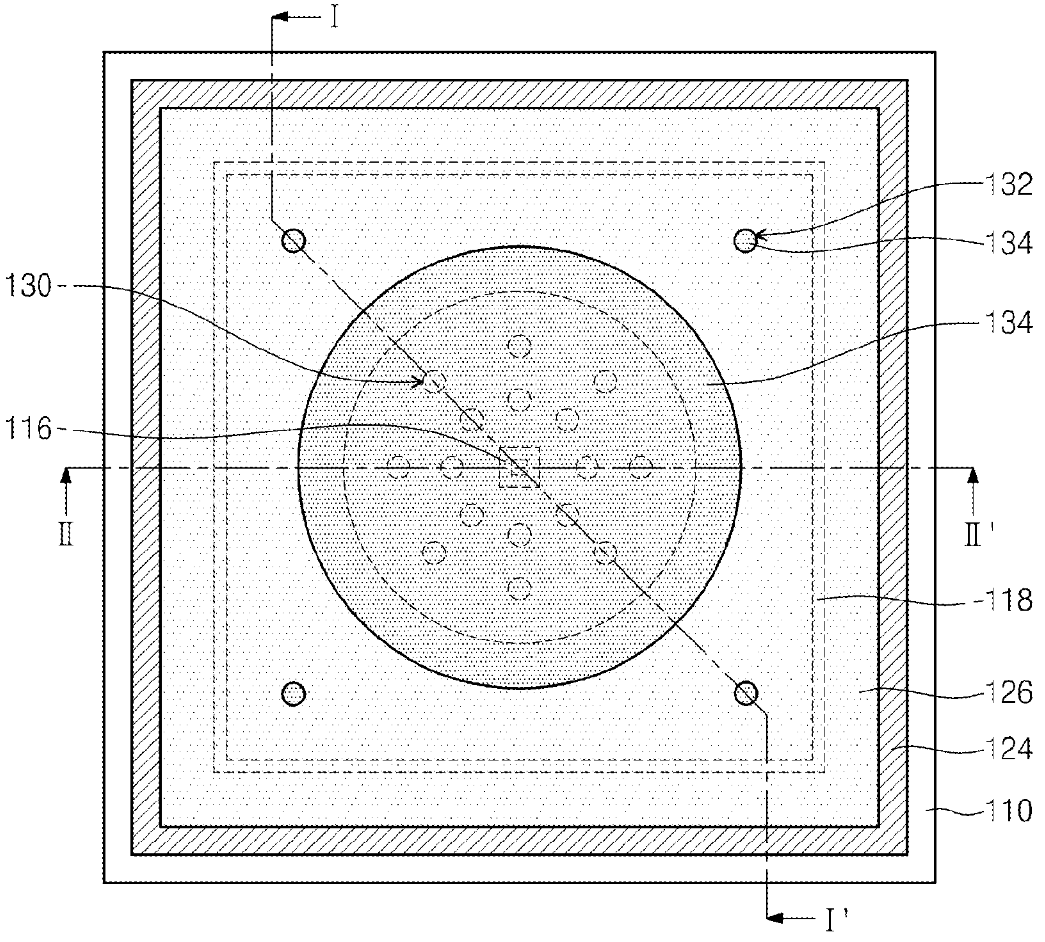
Figure 8B:
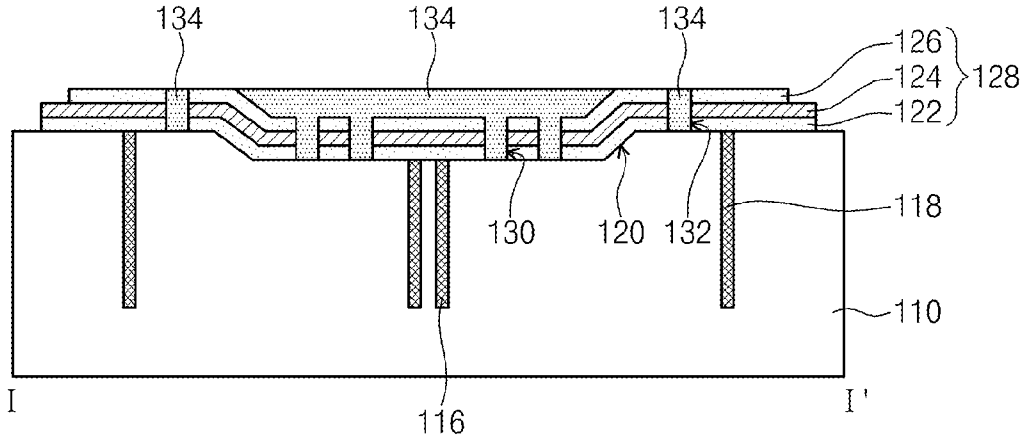
Figure 8C:
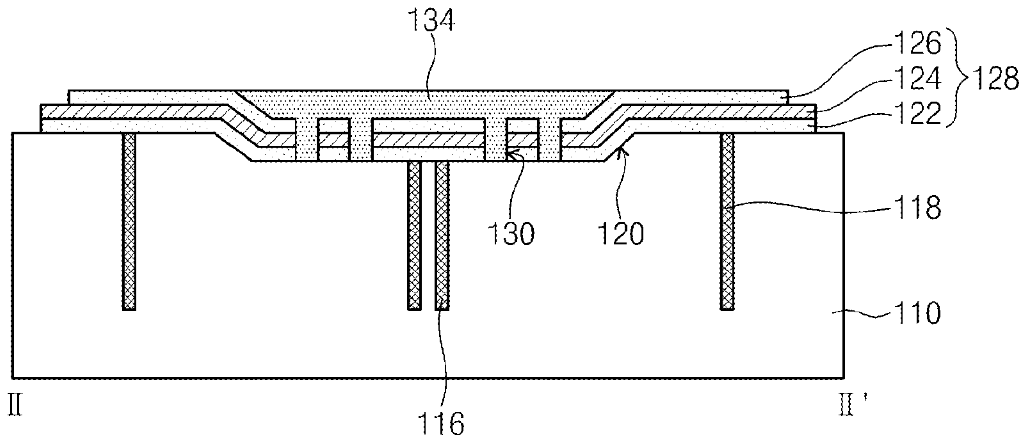

Referring to FIGS. 8A through 8C, a sacrificial layer 134 is formed on the lower electrode insulation layer 126. The sacrificial layer 134 is used for floating the diaphragm 136 of FIG. 9C formed later during the next process.

The sacrificial layer 134 may be formed of a material having a different etch selectivity than the interlayer insulation layer 122 and the lower electrode insulation layer 126. The sacrificial layer 134 may be formed of an oxide layer or an organic layer. The sacrificial layer 134 may be formed with a thickness of several μm.

The sacrificial layer 134 may be formed after depositing an oxide layer or an organic layer on the lower electrode insulation layer 126 and then etching the layer until the lower electrode insulation layer 126 is exposed. At this point, the acoustic chamber etching holes 130 and the acoustic chamber windows 132 are filled with the sacrificial layer 134.

Thereby, the top surface of the sacrificial layer 134 has the same height as the top surface of the lower electrode insulation layer 126 and is formed being planarized on the same plane.

Referring to FIGS. 9A through 9C, the diaphragm 136 is formed on the sacrificial layer 134 corresponding to diaphragm chamber 120.

The diaphragm 136 has a thickness of several μm and may be formed with a narrower area than the top of the diaphragm chamber 120. As one example, the diaphragm 136 may be formed with a circuit having a smaller radius than the top of the diaphragm chamber 120.

The diaphragm 136 may be formed with a single layer structure of a conductive layer or a stacked layer structure of an insulation layer and a conductive layer. Here, the conductive layer is used as a counter electrode and may be formed of metal. The insulation layer may be an oxide layer or an organic layer having a different etch selectivity than the sacrificial layer 134.

Figure 10A:
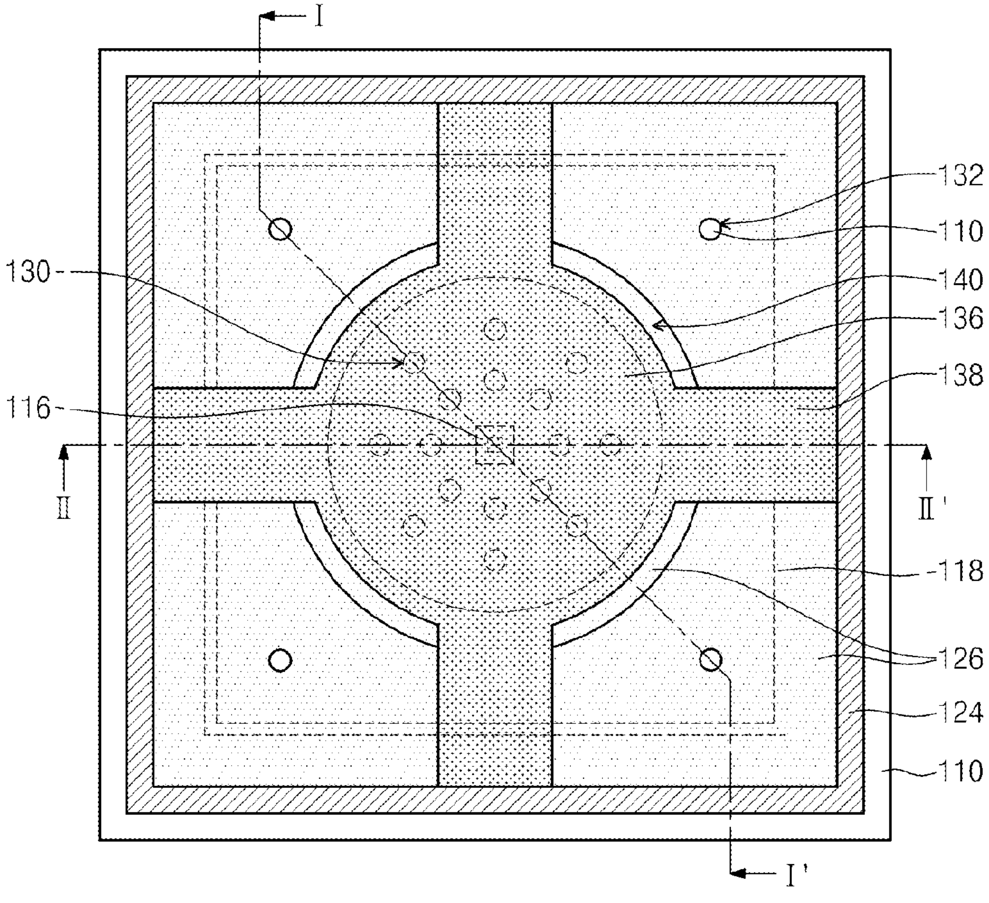
Figure 10B:
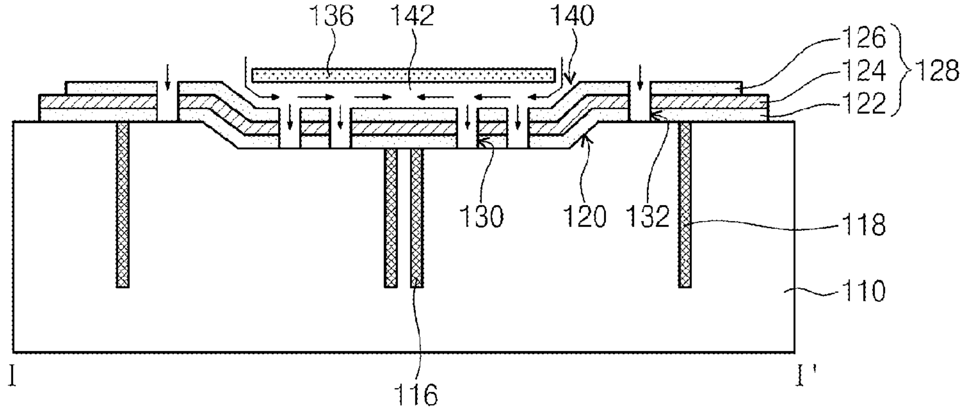

Since the edge surface of the sacrificial layer 134 is exposed at both sides of the diaphragm 136 through the forming of the diaphragm 136, the sacrificial layer etching windows 140 of FIG. 10B used for an inflow path of an etching solution or an etching gas for removing the sacrificial layer 134 may be obtained during the next process.

Moreover, during the forming of the diaphragm 136, diaphragm supporters 138 may be formed on the lower electrode insulation layer 126 at both sides of the diaphragm 136. The diaphragm supporters 138 may be integrally formed after extending from at least four edges of the diaphragm 136. The diaphragm supporters 138 may be symmetrically arranged.

Preferably, to suppress left-right movements of the diaphragm 136 and the diaphragm supporters 138 during vibration due to sound pressure, the diaphragm supporter 138 is formed through planarization with the diaphragm 136. That is, the diaphragm 136 and the diaphragm supporters 138 may be formed to have the top surface having the same height.

After a conductive layer or a stacked layer of an insulation layer and a conductive layer is formed on the sacrificial layer 134 and exposed the lower electrode insulation layer 126 and is patterned through a photolithography process, the diaphragm 136 and the diaphragm supporters 138 may be formed.

Figure 10C:
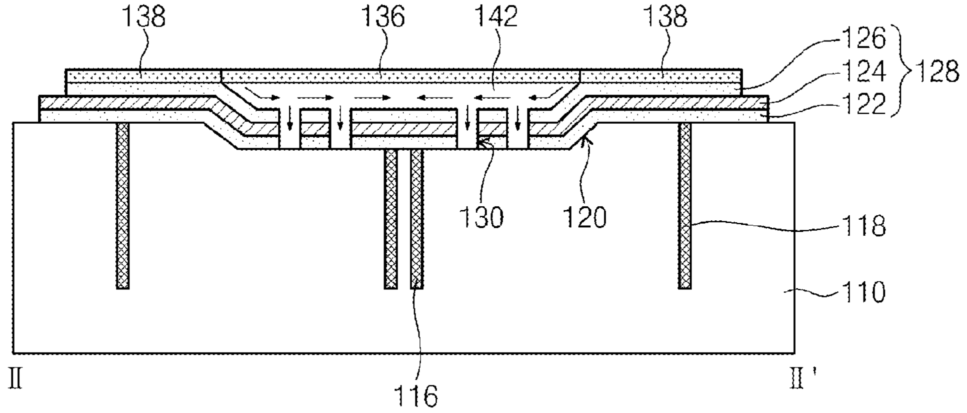

Referring to FIGS. 10A through 10C, the sacrificial layer 134 of FIG. 9B is removed through etching.

The sacrificial layer 134 of FIG. 9B may be removed through etching using a dry etching method or a wet etching method.

In relation to the etching process, if the sacrificial layer 134 of FIG. 9B is an oxide layer, the wet etching process may be performed using a Buffered Oxide Etchant (BOE), and the dry etching process may be performed using an HF gas.

In relation to the etching process, if the sacrificial layer 134 of FIG. 9B is an organic layer, the wet etching process may be performed using alcohol based solution and the dry etching process may be performed using $O_2$ gas.

That is, the etching process may be performed by injecting an etching solution or an etching gas (which is appropriate for a material used to form a sacrificial layer) on the sacrificial layer 134 of FIG. 9B. Then, as the etching solution or the etching gas flows into the sacrificial layer 134 provided on the diaphragm chamber 120 through the sacrificial layer etching windows 140, after the sacrificial layer 134 of FIG. 9B between the lower electrode insulation layer 126 and the diaphragm 136 is removed, the sacrificial layer 134 in the acoustic chamber etching holes 130 may be selectively etched and then removed. Here, the arrow indicates an etching progression direction of the etching solution or the etching gas.

The sacrificial layer 134 filled in the acoustic chamber windows 132 during the etching process is selectively etched and removed as it is exposed to an etching solution or an etching gas.

Therefore, a diaphragm gap 142, which is an empty space and used as a vibration space of the diaphragm 136, is formed between the diaphragm 136 and the lower electrode insulation layer 126 provided on the diaphragm chamber 120. As a result, the fixing electrode 128 provided on the diaphragm chamber 120 faces the diaphragm 136, being spaced a predetermined distance from each other.

The diaphragm gap 142 is connected to the acoustic chamber etching holes 130. The surface of the substrate 110 is partially exposed by the acoustic chamber etching holes 130 and the acoustic chamber windows 132

Like this, the sacrificial layer 134 may be etched through the sacrificial layer etching windows 140 using micro-fabrication technology and then is removed.

Figure 11C:
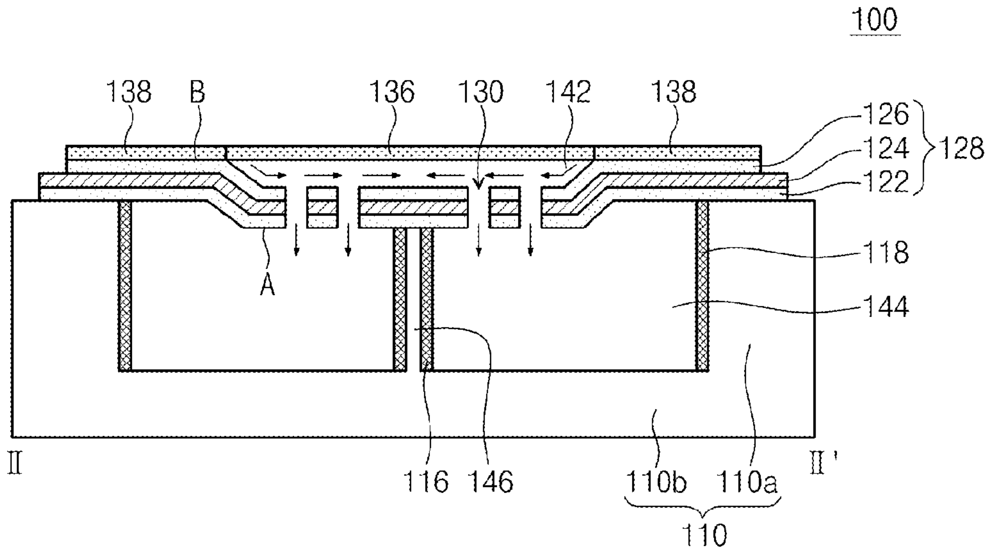

Referring to FIGS. 11A through 11C, an acoustic chamber 144 is formed in the upper portion region of the substrate 110.

The acoustic chamber 144 is formed by etching the upper portion of the substrate 110 through a dry etching or wet etching method.

The etching process may be a dry etching process when the substrate 110 is a Si substrate. The dry etching process may be performed using $XeF_2$ gas of isotropic etching. Unlike this, the etching process may be a wet etching process when the substrate 110 is a compound semiconductor. The wet etching process may be performed using $H_3PO_4$ solution or $H_2SO_4$ solution, for example.

That is, the etching process may be performed by injecting an etching solution or etching gas appropriate for a formation material of the substrate 110 on the diaphragm 136. Then, an etching solution or an etching gas inflowing through the sacrificial layer etching windows 140 flows into the acoustic chamber etching holes 130 through the diaphragm gap 142. As an etching solution or an etching gas flows into the acoustic chamber windows 132, the substrate 110 may be etched. Here, the arrow indicates a progression direction of the etching solution or the etching gas.

At this point, since the lower electrode supporter definition layer 116 and the acoustic chamber definition layer 118 serve as an etch stop layer, so that an acoustic chamber 144 may be formed in a region between the lower electrode supporter definition layer 116 below the concave portion A and the convex portion B of the fixing electrode 128 and the acoustic chamber definition layer 118. Because of the acoustic chamber definition layer 118 and the lower electrode supporter definition layer 116, a size of the acoustic chamber 144 may be defined.

Through the etching process, the substrate 110 may be formed including sidewall portions 110*a* and a bottom portion 110*b* extending from the bottom of the sidewall portions 110*a*.

Through the etching process, a lower electrode supporter 146 surrounded by the lower electrode supporter definition layer 116 is formed by extending from one region of the bottom portion 110*b* of the substrate 110 below the recess portion A of the fixing electrode 128. Like this, the lower electrode supporter 146 has a form determined along the inner circumference of the lower electrode supporter definition layer 116. At this point, the lower electrode supporter 146 serves a role supporting the fixing electrode 128.

A size of the acoustic chamber 144 is determined by en entire area of the diaphragm 136 detecting a change of electrostatic capacity, and its depth is determined at the maximum value that does not modify the lower electrode supporter 146.

Therefore, the acoustic sensor 100 including the fixing electrode 128, the diaphragm 136 facing the fixing electrode 128 and spaced a predetermined distance apart therefrom, the diaphragm supporter 138 planarized to be level with the diaphragm 136, the acoustic chamber 144, and the lower electrode supporter 146 may be completed.

According to an embodiment of the present invention, in relation to the acoustic sensor 100, since the diaphragm supporter 138 is formed to be level with the diaphragm 136, left-right movements of the diaphragm 136 and the diaphragm supporter 138 do not occur during vibration due to sound pressure. Therefore, frequency response characteristics may be improved by removing a nonlinear component. Moreover, the volume of the acoustic chamber 144 may be further increased through the lower electrode supporter 146, so that high sensitivity response characteristics may be obtained.

Furthermore, since the acoustic sensor 100 is manufactured through only the upper process of the substrate 110, compared to typical one using both upper and lower processes of a substrate, manufacturing processes may be simplified and through this, defects occurring during the manufacturing process may be minimized Therefore, a manufacturing yield may be improved.

Moreover, according to an embodiment of the present invention, although the acoustic sensor 100 including the lower electrode supporter 146 and the lower electrode supporter definition layer 116 is described above, it is apparent that the lower electrode supporter 146 and the lower electrode supporter definition layer 116 may be omitted whether the fixing electrode 128 is fixed or not.

An acoustic sensor according to an embodiment of the present invention may improve a frequency response rate by removing a nonlinear component caused due to left-right movements of a diaphragm and a diaphragm supporter and may raise the volume of an acoustic chamber through a lower electrode supporter, so that highly sensitive response may be obtained. Since an acoustic sensor may be manufactured only through an upper process of a substrate, manufacturing processes may be simplified and a process yield may be improved also compared to a typical one using all upper and lower processes of a substrate.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing an acoustic sensor, the method comprising:

forming a recess region in a substrate and an acoustic chamber definition layer surrounding the recess region and having a lower bottom surface than the recess region;

forming a lower electrode including a first hole provided in the substrate of the recess region and a second hole provided inside the acoustic chamber definition layer at the external of the recess region;

forming a diaphragm facing the lower electrode with a vibration space therebetween, on a lower electrode corresponding to the recess region, the diaphragm including a lower surface facing the lower electrode and an upper surface opposite to the lower surface, and a side connecting the lower surface and the upper surface;

forming diaphragm supporters on the lower electrode, the diaphragm supporters including a bottom surface facing the lower electrode and a top surface opposite to the bottom surface, a side connecting the bottom surface and the to surface, wherein the diaphragm and the diaphragm supports are disposed side by side such that the side of the diaphragm comes in contact with the side of the diaphragm supporters; and forming an acoustic chamber by etching the substrate inside the acoustic chamber definition layer through an etching window provided at a side of the diaphragm and the first and second holes connected to the vibration space.

2. The method of claim 1, wherein the diaphragm supporters extend from at least four edges of the diaphragm and is integrally formed with the diaphragm.

3. A method of manufacturing an acoustic sensor, the method comprising:

forming a recess region in a substrate and an acoustic chamber definition layer surrounding the recess region and having a lower bottom surface than the recess region;

forming a lower electrode including a first hole provided in the substrate of the recess region and a second hole provided inside the acoustic chamber definition layer at the external of the recess region;

forming a diaphragm facing the lower electrode with a vibration space therebetween, on a lower electrode corresponding to the recess region, and diaphragm supporters having a top surface having the same height as the diaphragm at a side of the diaphragm; and forming an acoustic chamber by etching the substrate inside the acoustic chamber definition layer through an etching window provided at a side of the diaphragm and the first and second holes connected to the vibration space, wherein the forming of the diaphragm and the diaphragm supporter further comprises:

forming a sacrificial layer planarized to be level with the lower electrode on the lower electrode corresponding to the recess region and inside the first and second holes;

forming a diaphragm on the sacrificial layer corresponding to the recess region and forming diaphragm supporters with a top surface having the same height as the diaphragm at a side of the diaphragm; and removing the sacrificial layer.

4. The method of claim 3, wherein the diaphragm is formed with a smaller region than a top portion of the recess region to expose an edge surface of the sacrificial layer.

5. The method of claim 4, before the forming of the diaphragm, further comprising forming an interlayer insulation layer below the lower electrode and forming a lower electrode insulation layer on the lower electrode, wherein the first and second holes are formed by penetrating from the lower electrode insulation layer to the interlayer insulation layer after the forming of the lower electrode insulation layer.

6. The method of claim 5, wherein the sacrificial layer is formed of a material having a different etch selectivity than the lower electrode insulation layer and the interlayer insulation layer.

7. The method of claim 6, wherein the sacrificial layer below the diaphragm is selectively etched and removed by allowing an etching solution or an etching gas to flow into the sacrificial layer below the diaphragm through an exposed edge surface of the sacrificial layer.

8. A method of manufacturing an acoustic sensor, the method comprising:

forming a recess region in a substrate and an acoustic chamber definition layer surrounding the recess region and having a lower bottom surface than the recess region;

forming a lower electrode including a first hole provided in the substrate of the recess region and a second hole provided inside the acoustic chamber definition layer at the external of the recess region;

forming a diaphragm facing the lower electrode with a vibration space therebetween, on a lower electrode corresponding to the recess region, and diaphragm supporters having a top surface having the same height as the diaphragm at a side of the diaphragm; and forming an acoustic chamber by etching the substrate inside the acoustic chamber definition layer through an etching window provided at a side of the diaphragm and the first and second holes connected to the vibration space, during the forming of the acoustic chamber definition layer, further comprising forming a lower electrode supporter definition layer surrounding one region of the substrate in the substrate below the recess region.

9. The method of claim 8, during the forming of the acoustic chamber, further comprising forming a lower electrode supporter extending from the bottom portion of the substrate below the recess region, wherein the lower electrode supporter is defined by the lower electrode supporter definition layer surrounding the outer wall thereof; and the first hole is formed at the external of the lower electrode supporter definition layer.

10. The method of claim 1, wherein the top surface of the diaphragm supporters is disposed at a level the same as a level at which the upper surface of the diaphragm is disposed.

* * * * *